(12) United States Patent
Choi et al.

(10) Patent No.: US 11,636,894 B2
(45) Date of Patent: *Apr. 25, 2023

(54) INTEGRATED CIRCUIT INCLUDING CELL ARRAY WITH WRITE ASSIST CELL

(71) Applicant: Samsung Electronics Co., Ltd., Suwon-si (KR)

(72) Inventors: Heekyung Choi, Hwaseong-si (KR); Taemin Choi, Seoul (KR); Seongook Jung, Seoul (KR); Keonhee Cho, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/335,509

(22) Filed: Jun. 1, 2021

(65) Prior Publication Data
US 2022/0148644 A1 May 12, 2022

(30) Foreign Application Priority Data
Nov. 6, 2020 (KR) .................. 10-2020-0148134

(51) Int. Cl.
*G11C 11/419* (2006.01)
*G11C 11/4096* (2006.01)
(Continued)

(52) U.S. Cl.
CPC ............ *G11C 11/4096* (2013.01); *G11C 5/06* (2013.01); *G11C 11/4085* (2013.01); *G11C 11/4094* (2013.01); *G11C 11/4099* (2013.01)

(58) Field of Classification Search
CPC .................................. G11C 11/4096
See application file for complete search history.

(56) References Cited

U.S. PATENT DOCUMENTS 7,898,875 B2    3/2011  Tao et al.
7,978,503 B2 *  7/2011  Koike ............... G11C 11/412
                                                      365/210.11
(Continued)

FOREIGN PATENT DOCUMENTS

KR    101488166 B1    2/2015

OTHER PUBLICATIONS

Guo, Zheng , et al., "A 23.6-Mb/mm 2 SRAM in 10-nm FinFET Technology With Pulsed-pMOS TVC and Stepped-WL for Low-Voltage Applications", IEEE Journal of Solid-State Circuits, vol. 54, No. 1, 2019, 210-216.

(Continued)

*Primary Examiner* — Min Huang
(74) *Attorney, Agent, or Firm* — Myers Bigel, P.A.

(57) ABSTRACT

An integrated circuit includes: a cell array including a plurality of memory cells in a plurality of first rows and a plurality of write assistance cells in at least one second row; a plurality of word lines respectively extending on the plurality of first rows; at least one write assistance line respectively extending on the at least one second row; and a row driver connected to the plurality of word lines and the at least one write assistance line, the row driver being configured to, during a write operation, activate at least one of the plurality of write assistance cells through the at least one write assistance line, wherein each of the plurality of write assistance cells includes the same transistor configuration as each of the plurality of memory cells and has the same footprint as each of the plurality of memory cells.

18 Claims, 13 Drawing Sheets

(51) Int. Cl.
    *G11C 11/408*    (2006.01)
    *G11C 5/06*      (2006.01)
    *G11C 11/4099*   (2006.01)
    *G11C 11/4094*   (2006.01)

(56) References Cited

U.S. PATENT DOCUMENTS

| | | | |
|---|---|---|---|
| 8,018,788 | B2 | 9/2011 | Jung et al. |
| 10,037,796 | B2 | 7/2018 | Singh et al. |
| 10,319,435 | B2 * | 6/2019 | Singh .................... G11C 11/419 |
| 10,553,275 | B2 * | 2/2020 | Lin ....................... G11C 11/419 |
| 2014/0286077 | A1 * | 9/2014 | Hatsuda .............. G11C 11/1659 |
| | | | 365/148 |
| 2015/0043270 | A1 | 2/2015 | Singh et al. |
| 2021/0098058 | A1 * | 4/2021 | Yang ................... H01L 27/1104 |
| 2022/0139442 | A1 * | 5/2022 | Choi ................... G11C 11/4094 |
| | | | 365/185.13 |

OTHER PUBLICATIONS

Karl, Eric, et al., "17.1 A 0.6V 1.5GHz 84Mb SRAM design in 14nm FinFET CMOS technology", 2015 IEEE International Solid-State Circuits Conference—(ISSCC) Digest of Technical Papers, San Francisco, CA, USA, 2015, 1-3.

Song, Taejoong, et al., "A 7nm FinFET SRAM using EUV lithography with dual write-driver-assist circuitry for low-voltage applications", 2018 IEEE International Solid-State Circuits Conference—(ISSCC), San Francisco, CA, USA, 2018, 198-200.

\* cited by examiner

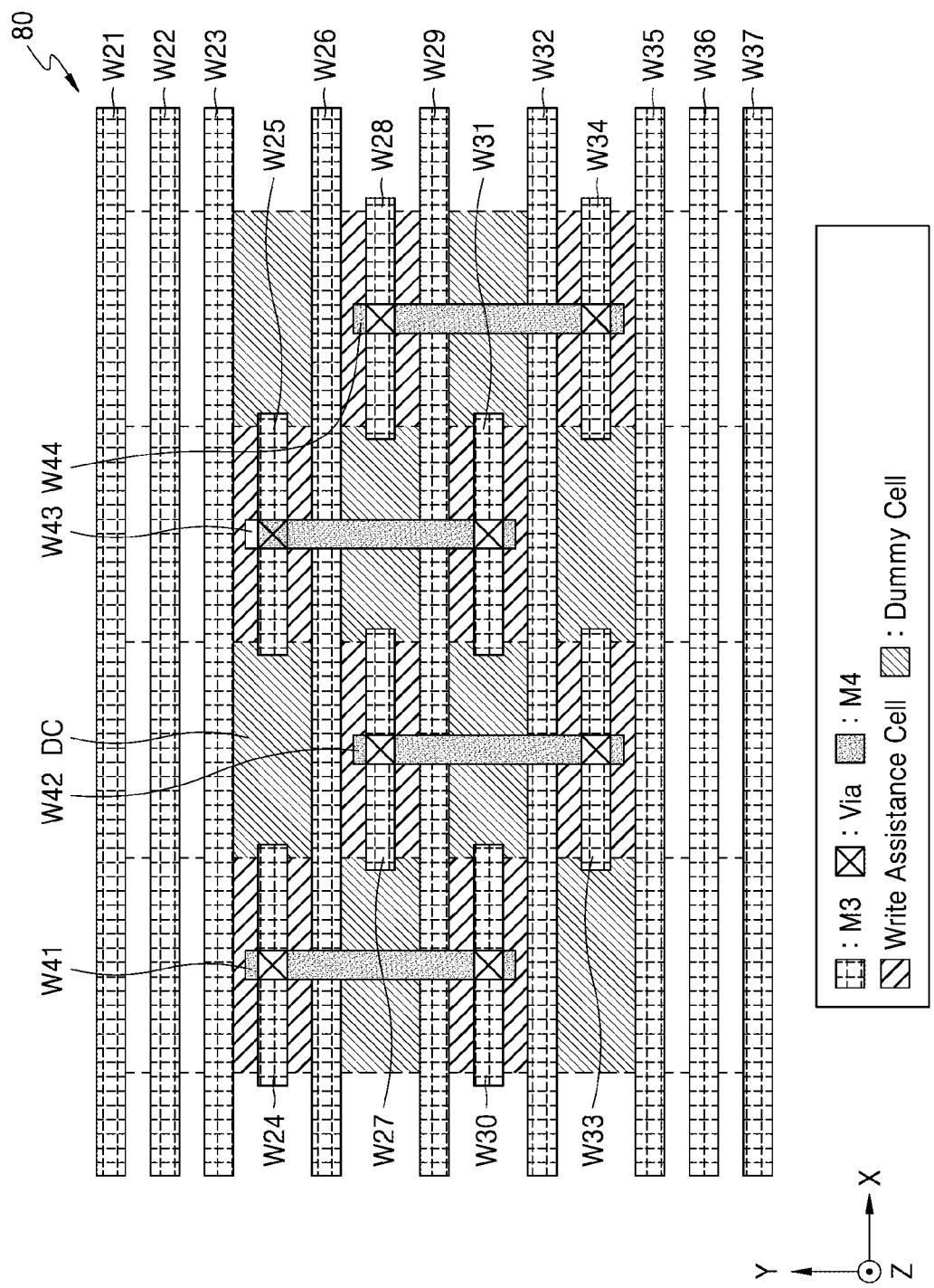

INTEGRATED CIRCUIT INCLUDING CELL ARRAY WITH WRITE ASSIST CELL

CROSS-REFERENCE TO RELATED APPLICATION

This application is based on and claims priority under 35 U.S.C. § 119 to Korean Patent Application No. 10-2020-0148134, filed on Nov. 6, 2020, in the Korean Intellectual Property Office, the disclosure of which is incorporated by reference herein in its entirety.

BACKGROUND

Embodiments of the inventive concept relate to an integrated circuit, and more particularly, to an integrated circuit including a cell array that includes a write assistance cell.

Due to the demand for high integration and the advance of semiconductor processes, widths, intervals, and/or heights of wiring lines included in integrated circuits may decrease, and parasitic elements of the wiring lines may increase. In addition, power supply voltages of integrated circuits may be reduced for reduced power consumption, high operation speed, and the like, and thus, parasitic elements of wiring lines may have more significant influences or impacts on the integrated circuits. Despite such parasitic elements, integrated circuits, which include cell arrays including memory cells, may be required to stably provide high performance according to requirements of various applications.

SUMMARY

The inventive concept provides an integrated circuit, which provides high operation reliability despite parasitic elements thereof, and an operating method of the integrated circuit.

According to an aspect of the inventive concept, there is provided an integrated circuit including: a cell array including a plurality of memory cells in a plurality of first rows and a plurality of write assistance cells in at least one second row; a plurality of word lines respectively extending on the plurality of first rows; at least one write assistance line respectively extending on the at least one second row; and a row driver connected to the plurality of word lines and the at least one write assistance line, the row driver being configured to activate at least one of the plurality of write assistance cells through the at least one write assistance line during a write operation, wherein each of the plurality of write assistance cells includes the same transistor configuration as each of the plurality of memory cells and has the same footprint as each of the plurality of memory cells.

According to an aspect of the inventive concept, there is provided an integrated circuit including: a cell array including a plurality of cells, each of the plurality of cells including the same transistor configuration and having the same footprint; and a row driver configured to, during a write operation, activate at least one write assistance cell from among the plurality of cells and select at least one memory cell from among the plurality of cells, wherein the plurality of cells include: the at least one memory cell including a plurality of memory cells arranged in a series of first rows; a first one of the at least one write assistance cell and a first dummy cell, which are arranged adjacent to each other in a second row; and a second dummy cell and a second one of the at least one write assistance cell, which are arranged adjacent to each other in a third row that is adjacent to the second row, wherein the first one of the at least one write assistance cell and the second dummy cell are arranged in a first column, and wherein the first dummy cell and the second one of the at least one write assistance cell are arranged in a second column that is adjacent to the first column.

According to an aspect of the inventive concept, there is provided an integrated circuit including: a cell array including a plurality of cells, each of the plurality of cells including the same transistor configuration and having the same footprint; and a row driver configured to, during a write operation, activate at least one write assistance cell from among the plurality of cells and select at least one memory cell from among the plurality of cells, wherein the plurality of cells include: the at least one memory cell including a plurality of first memory cells arranged in a series of first rows; the at least one write assistance cell including a plurality of first write assistance cells arranged in at least one second row that is adjacent to the series of first rows; and the at least one memory cell including a plurality of second memory cells arranged in a series of third rows that are adjacent to the at least one second row.

BRIEF DESCRIPTION OF THE DRAWINGS

Embodiments of the inventive concept will be more clearly understood from the following detailed description taken in conjunction with the accompanying drawings in which:

FIGS. 8A to 8C are plan views illustrating a layout of an integrated circuit, according to example embodiments of the inventive concept;

DETAILED DESCRIPTION OF THE EMBODIMENTS

Figure 1:
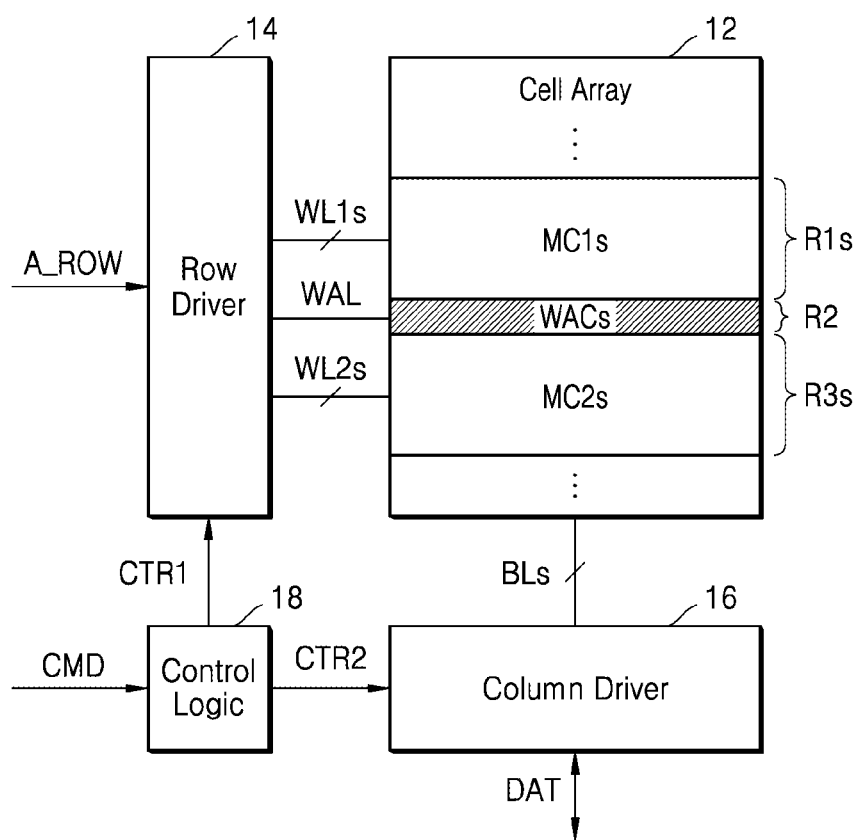
FIG. 1 is a block diagram illustrating an integrated circuit according to an example embodiment of the inventive concept.

FIG. 1 is a block diagram illustrating an integrated circuit according to an example embodiment of the inventive concept. Specifically, the block diagram of FIG. 1 illustrates a memory device 10 included in the integrated circuit. In some embodiments, the integrated circuit may store data based on commands and addresses provided from devices or systems that are external to the integrated circuit or outside thereof, and the memory device 10 may be a standalone memory device. In addition, in some embodiments, the integrated circuit may further include other components for writing data to or reading data from the memory device 10, as described below with reference to FIG. 12, and the memory device 10 may be an embedded memory device. As shown in FIG. 1, the memory device 10 may include a cell array 12, a row driver 14, a column driver 16, and control logic 18. Although not shown in FIG. 1, in some embodiments, the memory device 10 may further include an address buffer, a data buffer, a data input/output circuit, an internal voltage generator, and the like.

The memory device 10 may receive a command CMD, an address, and data. For example, the memory device 10 may receive the command CMD (which may be referred to as a write command) for instructing the memory device 10 to perform a write operation, an address (which may be referred to as a write address), and data (which may be referred to as write data), and may store the received data in a region of the cell array 12, which corresponds to the address. In addition, the memory device 10 may receive the command CMD (which may be referred to as a read command) for instructing the memory device to perform a read operation, and an address, and may output data stored in a region of the cell array 12, which corresponds to the address, to the outside thereof, such as, for example, a host or memory controller.

The cell array 12 may include a plurality of memory cells, each of the plurality of memory cells being accessed by a word line and a bit line. In some embodiments, the memory cells included in the cell array 12 may include volatile memory cells such as static random access memory (SRAM), dynamic random access memory (DRAM), or the like. In some embodiments, the memory cells included in the cell array 12 may include non-volatile memory cells, such as flash memory, resistive random access memory (RRAM), or the like. Although example embodiments will be described primarily with reference to an SRAM cell, as described below with reference to FIG. 3 and the like, it should be noted that the example embodiments are not limited thereto.

Referring to FIG. 1, the cell array 12 may include a plurality of first memory cells MC1s in a series of first rows R1s, may include a plurality of write assistance cells WACs in one or more second rows R2, and may include a plurality of second memory cells MC2s in a series of third rows R3s. Each of the plurality of first memory cells MC1s may be connected to one of a plurality of first word lines WL1s respectively extending on the series of first rows R1s and may be connected to at least one of a plurality of bit lines BLs respectively extending on a plurality of columns of the cell array 12. In addition, each of the plurality of second memory cells MC2s may be connected to one of a plurality of second word lines WL2s respectively extending on a series of third rows R3s and may be connected to at least one of the plurality of bit lines BLs.

Each of the plurality of write assistance cells WACs may be connected to a write assistance line WAL extending on each second row R2 and may be connected to at least one of the plurality of bit lines BLs. A write assistance cell (or a write assist cell) may assist a write operation in which data is written to a memory cell. For example, the write assistance cell may compensate for an effect caused by parasitic elements of the plurality of bit lines BLs during a write operation, and thus, the memory device 10 may have a high or improved standard of writing reliability. Examples of the write assistance cell will be described below with reference to FIG. 3 and the like.

As described below with reference to FIG. 2 and the like, each of the plurality of write assistance cells WACs may include the same transistors as a memory cell, that is, as each of the plurality of first memory cells MC1s and the plurality of second memory cells MC2s, and may have the same footprint as each thereof. Accordingly, the plurality of write assistance cells WACs may be formed by the same or similar processes of forming the plurality of first memory cells MC1s and the plurality of second memory cells MC2s and may not affect structures of the plurality of first memory cells MC1s and the plurality of second memory cells MC2s. As a result, due to a uniform structure of the write assistance cell with the plurality of first memory cells MC1s and the plurality of second memory cells MC2s, effects caused by parasitic elements of bit lines extending in the cell array 12 with large capacity may be efficiently removed, and a high yield of the integrated circuit including the memory device 10 may be achieved.

The row driver 14 may be connected to the cell array 12 through the plurality of first word lines WL1s, the write assistance line WAL, and the plurality of second word lines WL2s. The row driver 14 may activate one word line from among the plurality of first word lines WL1s and the plurality of second word lines WL2s based on a row address A_ROW. Accordingly, memory cells connected to the activated word line may be selected from among the plurality of first memory cells MC1s and the plurality of second memory cells MC2s. In addition, the row driver 14 may activate the write assistance line WAL during a write operation. In some embodiments, the row driver 14 may be connected to the plurality of write assistance cells WACs through a plurality of write assistance lines extending on a plurality of second rows R2 and may activate one of the plurality of write assistance lines, based on a column address (e.g., A_COL of FIG. 9). Examples of operations of the row driver 14 will be described below with reference to FIG. 4, FIG. 9, and the like.

The column driver 16 may be connected to the cell array 12 through the plurality of bit lines BLs. During a read operation, the column driver 16 may identify values stored in the memory cells connected to the activated word line, that is, in the selected memory cells, by sensing currents and/or voltages received through the plurality of bit lines BLs, and may output data DAT based on the identified current and/or voltage values. In addition, during a write operation, the column driver 16 may apply currents and/or voltages to the plurality of bit lines BLs, based on the data DAT, and may write values to the memory cells connected to the activated word line, that is, to the selected memory cells. In some embodiments, the plurality of bit lines BLs may include at least one pseudo bit line (e.g., BLP1, BLP2, BLBP1, and BLBP2 of FIG. 6) for a word line assistance cell, as described below with reference to FIGS. 5 and 6.

The control logic 18 may receive the command CMD and may generate first and second control signals CTR1 and CTR2. For example, the control logic 18 may identify a read command by decoding the command CMD and may generate the first and second control signals CTR1 and CTR2 to read the data DAT from the cell array 12. In addition, the control logic 18 may identify a write command by decoding the command CMD and may generate the first and second control signals CTR1 and CTR2 to write the data DAT to the cell array 12. In some embodiments, the row driver 14 may activate or deactivate a word line and/or a write assistance line at a timing determined based on the first control signal CTR1. In addition, in some embodiments, the column driver 16 may sense a current and/or a voltage from or apply a current and/or a voltage to the plurality of bit lines BLs, at a timing determined based on the second control signal CTR2.

Figure 2:
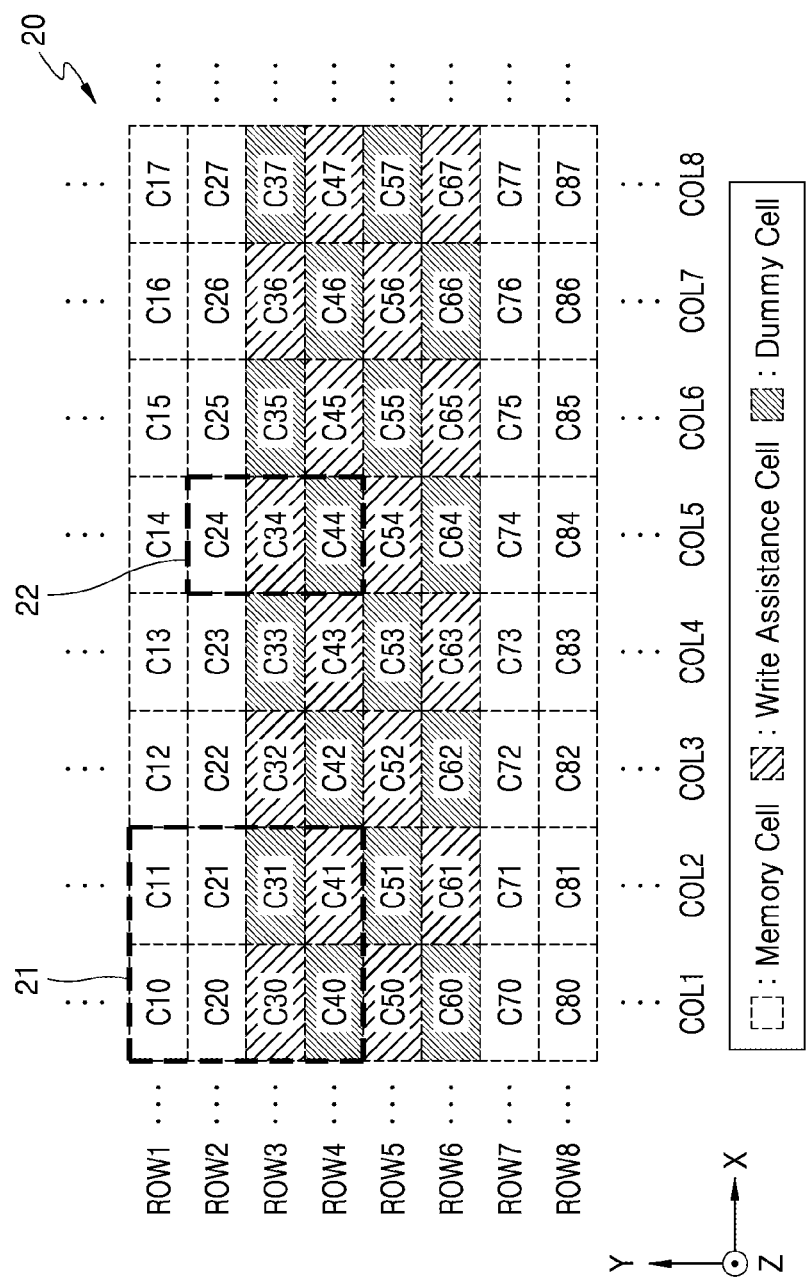
FIG. 2 is a plan view illustrating a layout of a cell array, according to an example embodiment of the inventive concept.

FIG. 2 is a plan view illustrating a layout of a cell array 20, according to an example embodiment of the inventive concept. Specifically, the plan view of FIG. 2 schematically illustrates a portion of the cell array 20 in a plane formed by an X-axis and a Y-axis. Herein, the plane formed by the X-axis and the Y-axis may be referred to as a horizontal plane, and a direction of a Z-axis may be referred to as a vertical direction. In addition, a component arranged farther in a +Z direction than another component may be referred to as being over or on the other component, and a component arranged farther in a −Z direction than another component may be referred to as being under the other component. In addition, the area of a component may refer to the size occupied by the component in a plane parallel to the horizontal plane. In the figures herein, only some layers may be illustrated for convenience of illustration. Herein, a pattern including a conductive material, such as a pattern of a wiring layer, may be referred to as a conductive pattern or simply as a pattern, and components electrically connected to each other through a conductive pattern may be referred to simply as components connected to each other. Components connected to each other without any intervening elements may be considered to be directly connected.

Referring to FIG. 2, the cell array 20 may include a plurality of cells C10, . . . , and C87, each having the same footprint, and the plurality of cells C10, . . . , and C87 may include memory cells, write assistance cells, and dummy cells. For example, as shown in FIG. 2, the cell array 20 may include cells (e.g., C10 to C17 and the like) as the memory cells in first, second, seventh, and eighth rows ROW1, ROW2, ROW7, and ROW8. In addition, the cell array 20 may include cells (e.g., C30 and the like) as the write assistance cells and cells (e.g., C31 and the like) as the dummy cells in third to sixth rows ROW3 to ROW6. In some embodiments, the memory cells may be consecutively arranged in one row, and the write assistance cells and the dummy cells may be alternately arranged in one row. For example, as shown in FIG. 2, the cells C42 and C44 adjacent to the cell C43, which is a write assistance cell, in a row direction, and the cells C33 and C53 adjacent to the cell C43 in a column direction may be dummy cells. An example of a layout of an area 21 including the eight cells C10, C11, C20, C21, C30, C31, C40, and C41 will be described with reference to FIG. 7, and an example of a circuit corresponding to an area 22 including the three cells C24, C34, and C44 will be described with reference to FIG. 3.

In some embodiments, unlike the example shown in FIG. 2, the write assistance cells and the dummy cells may be arranged in two consecutive rows between the memory cells, and, for example, the write assistance cells and the dummy cells arranged in the fifth and sixth rows ROW5 and ROW6 may be replaced with the memory cells. In addition, in some embodiments, the dummy cells may be omitted, and the write assistance cells may be arranged in one row between the memory cells.

A plurality of word lines may extend parallel to the X-axis, and a plurality of bit lines may extend parallel to the Y-axis. For example, the cells C20 to C27 arranged in the second row ROW2 may be connected to a word line extending parallel to the X-axis on the second row ROW2 and may be respectively connected to bit lines respectively extending parallel to the Y-axis in first to eighth columns COL1 to COL8. The memory cells arranged in one row may be simultaneously written or read or may be written or read on a group basis. For example, the memory cells arranged in one row may be divided into a plurality of groups, each including memory cells spaced apart at equal intervals, and the plurality of groups may be respectively written or read at different time points. As such, the writing or reading of the memory cells, which are arranged in one row, on a group basis at different time points may be referred to as bit interleaving, and the bit interleaving may reduce local noise generated during a write operation and/or a read operation.

A plurality of write assistance lines may extend parallel to the X-axis. For example, some of the cells C50 to C57 arranged in the fifth row ROW5 may be connected to a write assistance line extending parallel to the X-axis on the fifth row ROW5, and the cells C50 to C57 arranged in the fifth row ROW5 may be respectively connected to bit lines respectively extending parallel to the Y-axis in the first to eighth columns COL1 to COL8. The write assistance cell may assist a write operation on a memory cell that is arranged in the same column as the write assistance cell. For example, the cells C30 and C50, which are write assistance cells, arranged in the first column COL1 may be connected to the same write assistance line, and the cells C30 and C50 may reduce effects due to parasitic elements of a bit line extending on the first column COL1 during a write operation on the cells C10, C20, C70, and C80, which are memory cells also arranged in the first column COL1.

When data is written based on the bit interleaving described above, the write assistance cells corresponding to columns in which the memory cells included in a group are arranged may be activated. For example, in the cell array 20, the bit interleaving may be implemented based on four groups, that is, a first group including the cells C10, C20, C70, C80, C14, C24, C74, and C84 arranged in the first and fifth columns COL1 and COL5, a second group including the cells C11, C21, C71, C81, C15, C25, C75, and C85 arranged in the second and sixth columns COL2 and COL6, a third group including the cells C12, C22, C72, C82, C16, C26, C76, and C86 arranged in the third and seventh columns COL3 and COL7, and a fourth group including the cells C13, C23, C73, C83, C17, C27, C77, and C87 arranged in the fourth and eighth columns COL4 and COL8. In this case, the cells C30, C50, C34, and C54 arranged in the first and fifth columns COL1 and COL5 may be activated during a write operation on the first group, the cells C41, C61, C45, and C65 arranged in the second and sixth columns COL2 and COL6 may be activated during a write operation on the second group, the cells C32, C52, C36, and C56 arranged in the third and seventh columns COL3 and COL7 may be activated during a write operation on the third group, and the cells C43, C63, C47, and C67 arranged in the fourth and eighth columns COL4 and COL8 may be activated during a write operation on the fourth group. In addition, to select write assistance cells during a write operation, four write assistance lines may respectively extend parallel to the X-axis on the third to sixth rows ROW3 to ROW6.

Figure 3:
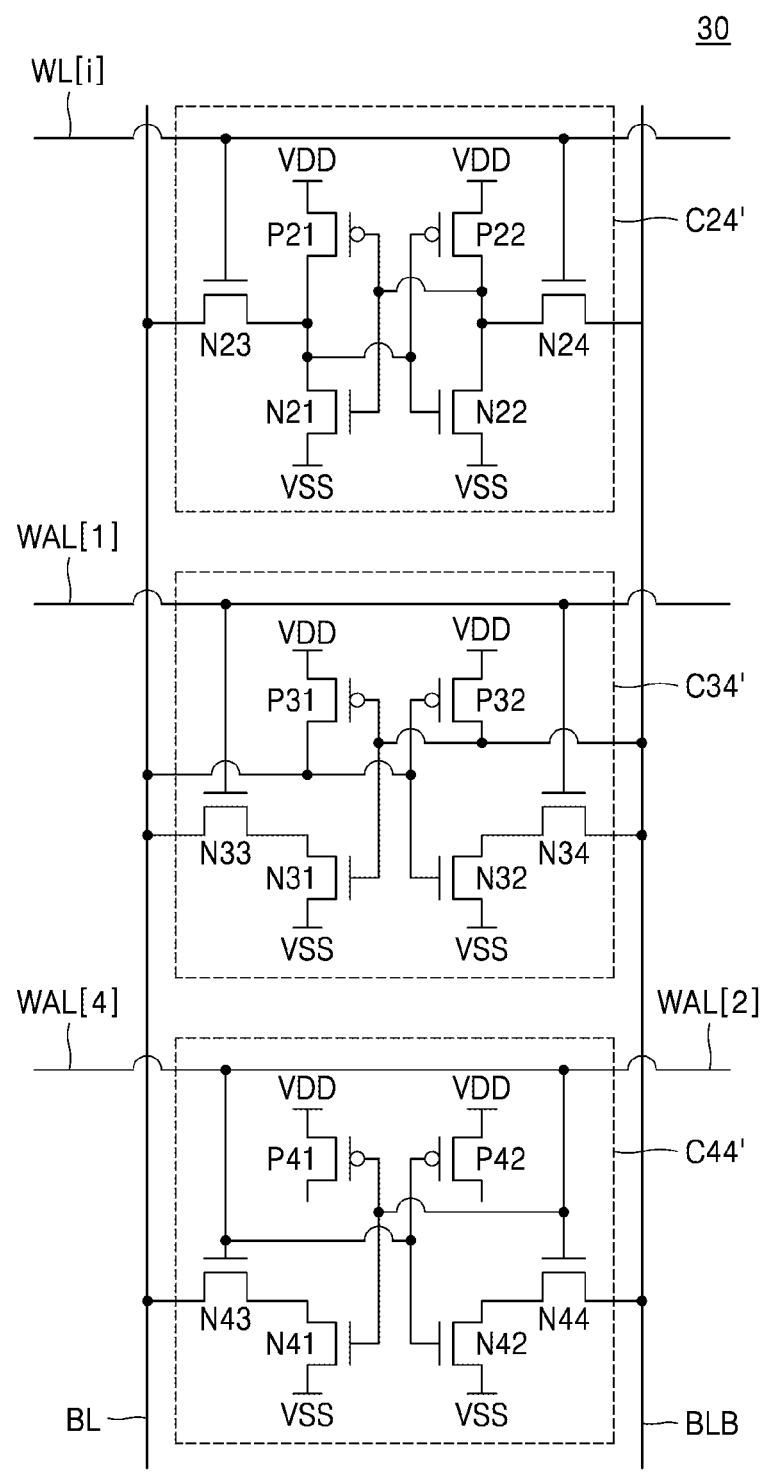
FIG. 3 is a circuit diagram illustrating examples of a memory cell, a write assistance cell, and a dummy cell, according to an example embodiment of the inventive concept.

FIG. 3 is a circuit diagram illustrating examples of a memory cell, a write assistance cell, and a dummy cell, according to an example embodiment of the inventive concept. Specifically, the circuit diagram of FIG. 3 illustrates an equivalent circuit 30 corresponding to the three cells C24, C34, and C44 included in the area 22 of FIG. 2. As described above with reference to FIG. 2, a memory cell C24', a write assistance cell C34', and a dummy cell C44' in FIG. 3 may be arranged in the same column, that is, the fifth column COL5 of FIG. 2. Hereinafter, descriptions regarding FIG. 3 will be made with reference to FIG. 2.

The memory cell C24', the write assistance cell C34', and the dummy cell C44', which are arranged in the same column, may be commonly connected to a pair of bit lines. For example, as shown in FIG. 3, the pair of bit lines including a bit line BL and a complementary bit line BLB may extend on the fifth column COL5, and the memory cell C24', the write assistance cell C34', and the dummy cell C44' may be commonly connected to each of the bit line BL and the complementary bit line BLB. In addition, the memory cell C24' may be connected to a word line WL[i] (where i is an integer greater than 0), the write assistance cell C34' may be connected to a first write assistance line WAL[1] from among four write assistance lines WAL[4:1], and the dummy cell C44' may be connected to a second write assistance line WAL[2] and a fourth write assistance line WAL[4].

Referring to FIG. 3, the memory cell C24' may include first and second p-channel field effect transistors (PFETs) P21 and P22 and first to fourth n-channel field effect transistors (NFETs) N21 to N24. The memory cell C24' may be a six transistors (6T)-SRAM cell and may include a pair of inverters cross-coupled to each other between a first power node, to which a positive supply voltage VDD is applied, and a second power node, to which a negative supply voltage (or a ground potential) VSS is applied. In the pair of inverters cross-coupled, a first inverter may include a first PFET P21 and a first NFET N21, and a second inverter may include a second PFET P22 and a second NFET N22. In addition, third and fourth NFETs N23 and N24 may be referred to as pass transistors respectively connecting the first and second inverters to the bit line BL and the complementary bit line BLB by the word line WL[i] that is activated (e.g., having a high-level voltage).

Each of the write assistance cell C34' and the dummy cell C44' may include the same transistors as the memory cell C24'. For example, as shown in FIG. 3, the write assistance cell C34' may include first and second PFETs P31 and P32 and first to fourth NFETs N31 to N34, which respectively correspond to the first and second PFETs P21 and P22 and the first to fourth NFETs N21 to N24 of the memory cell C24'. In addition, the dummy cell C44' may include first and second PFETs P41 and P42 and first to fourth NFETs N41 to N44, which respectively correspond to the first and second PFETs P21 and P22 and the first to fourth NFETs N21 to N24 of the memory cell C24'. Accordingly, as described below with reference to FIG. 7, each of the write assistance cell C34' and the dummy cell C44' may include active regions and gate electrodes corresponding to a layout of the memory cell C24'.

Herein, transistors may have arbitrary structures. For example, the transistors may include a fin field effect transistor (FinFET) formed by an active pattern, which extends with a fin shape, and a gate electrode. The transistors may include a multi-bridge channel FET (MBCFET) formed by a plurality of nanosheets extending parallel to each other and a gate electrode. The transistors may include a ForkFET having a structure, in which an N-type transistor is closer to a P-type transistor by isolating nanosheets for the P-type transistor from nanosheets for the N-type transistor by a dielectric wall. The transistors may include a vertical FET (VFET), which includes source/drain regions spaced apart from each other in the Z-axis direction in FIG. 2 and a gate electrode bordering or surrounding a channel region. The transistors may include FETs, such as complementary FETs (CFETs), negative FETs (NCFETs), or carbon nanotube (CNT) FETs, or may include bipolar junction transistors or other three-dimensional transistors.

Referring to FIG. 3, in the write assistance cell C34', the first PFET P31, the third NFET N33, and the first NFET N31 may be connected in series between the positive supply voltage VDD and the negative supply voltage VSS, and the second PFET P32, the fourth NFET N34, and the second NFET N32 may also be connected in series between the positive supply voltage VDD and the negative supply voltage VSS. Accordingly, during a write operation, when the first write assistance line WAL[1] is activated, the write assistance cell C34' may function as a pair of cross-coupled inverters and may amplify voltages applied to the bit line BL and the complementary bit line BLB. An example of an operation of the write assistance cell C34' will be described below with reference to FIG. 4.

Referring to FIG. 3, in the dummy cell C44', each of the first and second PFETs P41 and P42 may include a floated current terminal (e.g., a drain). In addition, each of the first PFET P41 and the first NFET N41 may include a control terminal (e.g., a gate) connected to the second write assistance line WAL[2], and each of the second PFET P42 and the second NFET N42 may include a control terminal connected to the fourth write assistance line WAL[4]. A row driver (e.g., 14 of FIG. 1) may activate each of the four write assistance lines WAL[4:1] in a mutually exclusive manner, and thus, the second write assistance line WAL[2] and the fourth write assistance line WAL[4] may not be simultaneously activated. As a result, the dummy cell C44' may not affect voltages of the bit line BL and the complementary bit line BLB.

Figure 4:
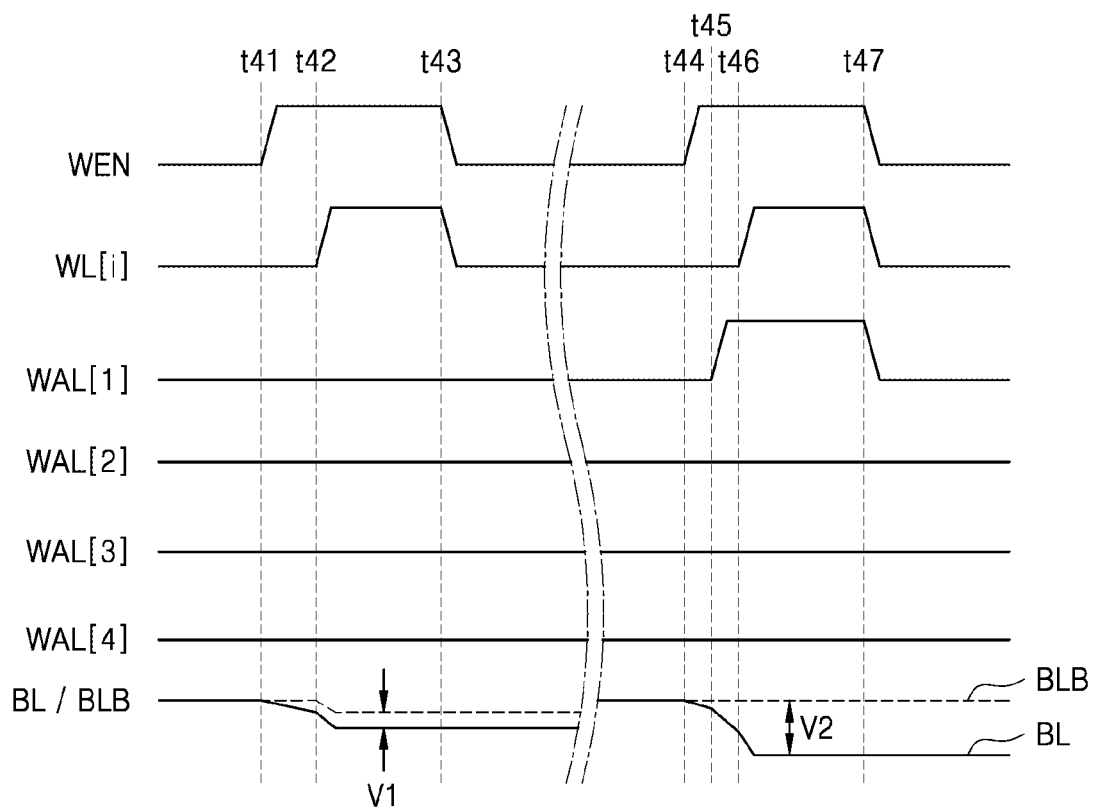
FIG. 4 is a timing diagram illustrating a write operation according to an example embodiment of the inventive concept.

FIG. 4 is a timing diagram illustrating a write operation according to an example embodiment of the inventive concept. Specifically, the timing diagram of FIG. 4 illustrates signals of the equivalent circuit 30 of FIG. 3 over time, in each of the case of not using a write assistance cell and the case of using the write assistance cell, during a write operation. Herein, although signals are assumed to be active-high signals having high levels during activation, it will be understood that example embodiments are not limited thereto. Hereinafter, descriptions regarding FIG. 4 will be made with reference to FIGS. 1 and 3, and repeated descriptions will be omitted.

Referring to FIG. 4, at time t41, a write enable signal WEN may be activated. For example, the first control signal CTR1 and the second control signal CTR2 of FIG. 1 may include the write enable signal WEN, and the control logic 18 may activate the write enable signal WEN based on a write command. In response to the activated write enable signal WEN, the column driver 16 may respectively apply voltages (e.g., VSS and VDD), which correspond to the data DAT, to the bit line BL and the complementary bit line BLB. Accordingly, the voltage of the bit line BL and the voltage of the complementary bit line BLB may gradually grow apart from each other, as shown in FIG. 4.

At time t42, the word line WL[i] may be activated. For example, the row driver 14 may delay the write enable signal WEN and may activate the word line WL[i] at a time point (i.e., t42) delayed from a time point (i.e., t41) at which the write enable signal WEN is activated. While the pair of cross-coupled inverters of the memory cell C24' may be connected to the bit line BL and the complementary bit line BLB due to the activated word line WL[i], a decrease in the voltage of the bit line BL at time t42 may be insufficient due to parasitic elements of the bit line BL and the complementary bit line BLB. Accordingly, as shown in FIG. 4, a first voltage V1 between the bit line BL and the complementary bit line BLB may be less than a second voltage V2 therebetween, which will be described below, and a write failure may occur.

At time t43, the write enable signal WEN and the word line WL[i] may be deactivated. For example, the control logic 18 may generate the deactivated write enable signal WEN, and the row driver 14 may deactivate the word line WL[i] in response to the deactivated write enable signal WEN.

At time t44, the write enable signal WEN may be activated. In response to the activated write enable signal WEN, the column driver 16 may respectively apply voltages corresponding to the data DAT to the bit line BL and the complementary bit line BLB. Accordingly, the voltage of the bit line BL and the voltage of the complementary bit line BLB may gradually grow apart from each other, as shown in FIG. 4.

At time t45, the first write assistance line WAL[1] may be activated. For example, the row driver 14 may delay the write enable signal WEN and may activate the first write assistance line WAL[1] at a time point (i.e., t45) delayed from a time point (i.e., t44) at which the write enable signal WEN is activated. The pair of cross-coupled inverters of the write assistance cell C34' may be connected to the bit line BL and the complementary bit line BLB due to the activated first write assistance line WAL[1], and thus, while the voltage of the bit line BL may decrease more sharply, the voltage of the complementary bit line BLB may be maintained approximately at the positive supply voltage VDD.

At time t46, the word line WL[i] may be activated. For example, the row driver 14 may activate the first write assistance line WAL[1] and then activate the word line WL[i], based on the activated write enable signal WEN. Despite the parasitic elements of the bit line BL and the complementary bit line BLB, the voltage of the bit line BL may sufficiently decrease due to the write assistance cell C34' connected to the bit line BL and the complementary bit line BLB in advance. Accordingly, as shown in FIG. 4, the second voltage V2 between bit line BL and the complementary bit line BLB may be greater than the first voltage V1 therebetween, which is described above, and a write operation may be successful.

Figure 5:
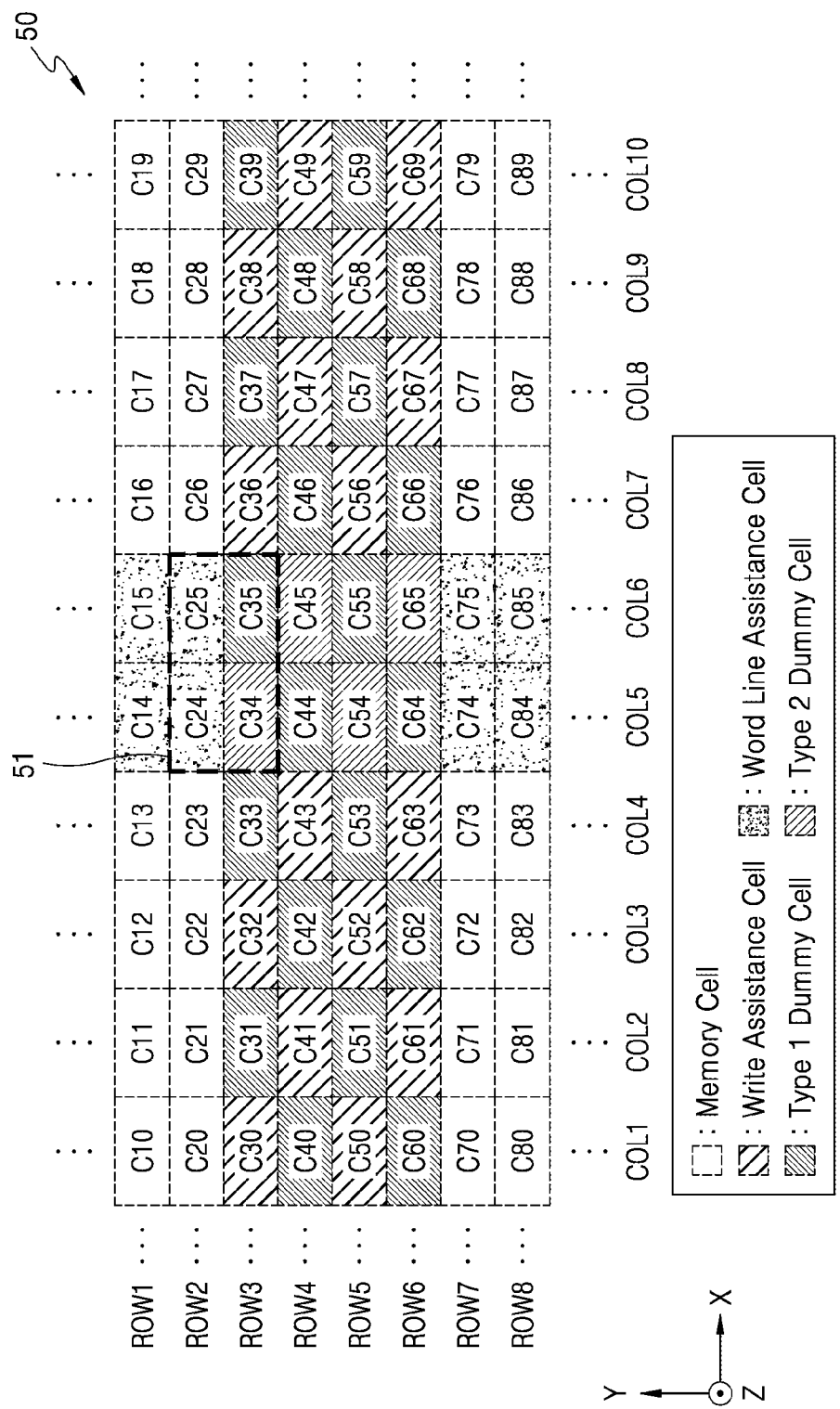
FIG. 5 is a plan view illustrating a layout of a cell array, according to an example embodiment of the inventive concept.

FIG. 5 is a plan view illustrating a layout of a cell array 50, according to an example embodiment of the inventive concept. Specifically, the plan view of FIG. 5 schematically illustrates a portion of the cell array 50 in a plane formed by the X-axis and the Y-axis. As compared with the cell array 20 of FIG. 2, the cell array 50 may further include word line assistance cells (or performance assistance cells) and may include different types of dummy cells. Hereinafter, in the descriptions regarding FIG. 5, repeated descriptions given with reference to FIG. 2 will be omitted.

Referring to FIG. 5, the cell array 50 may include a plurality of cells C10 to C89 having the same footprint, and the plurality of cells C10 to C89 may include memory cells, write assistance cells, word line assistance cells, first-type dummy cells, and second-type dummy cells. The cells C14, C15, C24, C25, C74, C75, C84, and C85 from among the cells arranged in the fifth and sixth columns COL5 and COL6 may be word line assistance cells. A word line assistance cell may assist the selection of memory cells arranged in the same row as the word line assistance cell. For example, the cells C14 and C15, which are word line assistance cells and are arranged in the first row ROW1, may reduce the effects caused by parasitic elements of a word line extending on the first row ROW1 to select the cells C10 to C13 and C16 to C19, which are memory cells and are arranged in the first row ROW1. To this end, pseudo bit lines (e.g., BLP1, BLP2, BLBP1, and BLBP2 of FIG. 6) may extend on the fifth and sixth columns COL5 and COL6, in which the word line assistance cells are arranged.

The cell array 50 may include dummy cells respectively corresponding to different circuits, that is, first-type dummy cells and second-type dummy cells, in intersecting areas between rows, in which the write assistance cells are arranged, and columns, in which the word line assistance cells are arranged. For example, as shown in FIG. 5, the cell array 50 may include the cells C35, C44, C55, and C64, which are first-type dummy cells, and the cells C34, C45, C54, and C65, which are second-type dummy cells, in intersecting areas between the third to sixth rows ROW3 to ROW6, in which the write assistance cells are arranged, and the fifth and sixth columns COL5 and COL6, in which the word line assistance cells are arranged. In some embodiments, a first-type dummy cell may be the same as a dummy cell arranged adjacent to a write assistance cell, that is, as a dummy cell of FIG. 2. An example of a circuit corresponding to an area 51 including the four cells C24, C25, C34, and C35, which respectively correspond to word line assistance cells, a second-type dummy cell, and a first-type dummy cell, will be described with reference to FIG. 6.

Figure 6:
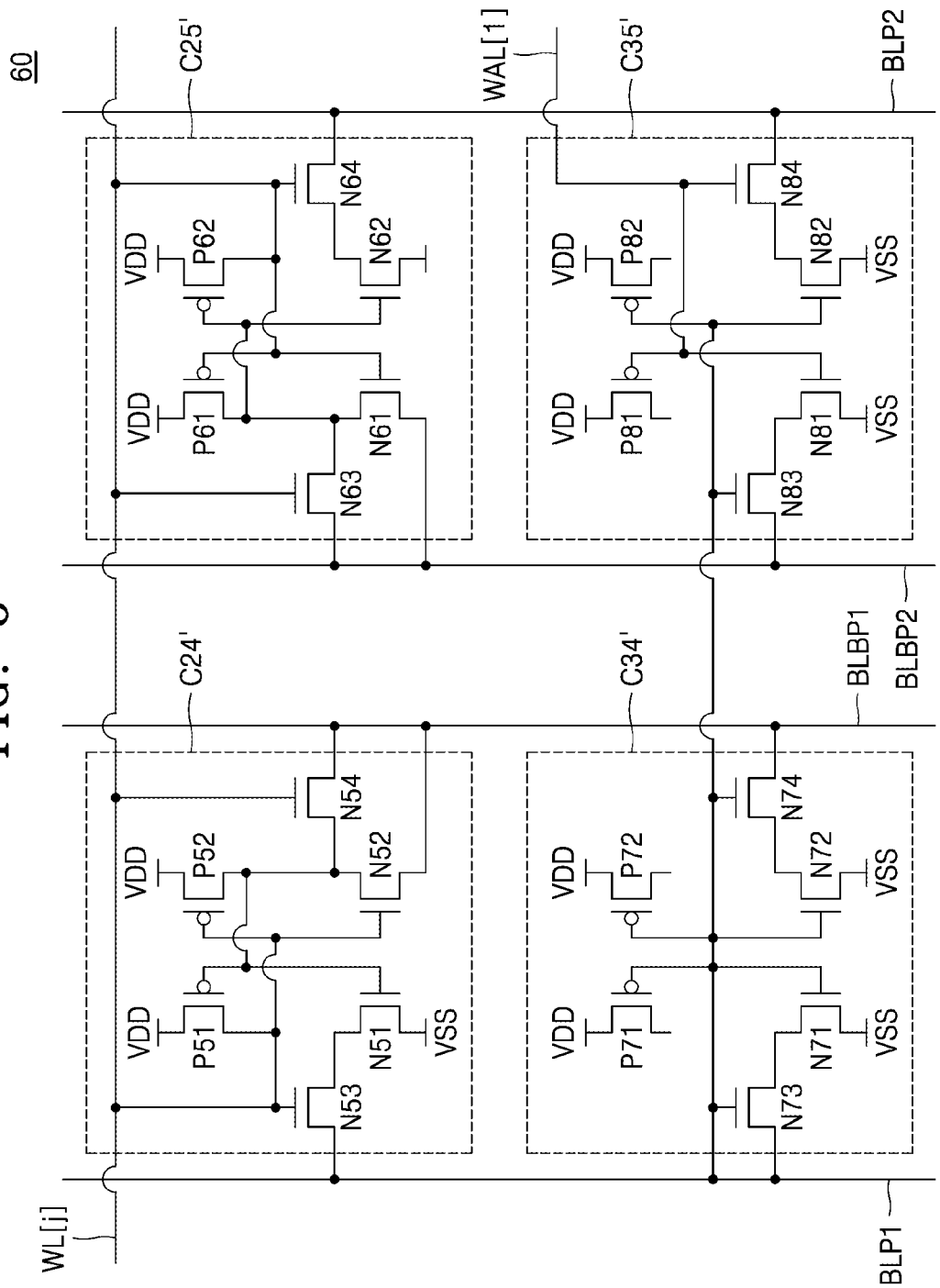
FIG. 6 is a circuit diagram illustrating examples of word line assistance cells and dummy cells, according to an example embodiment of the inventive concept.

FIG. 6 is a circuit diagram illustrating examples of word line assistance cells and dummy cells, according to an example embodiment of the inventive concept. Specifically, the circuit diagram of FIG. 6 illustrates an equivalent circuit 60 corresponding to the four cells C24, C25, C34, and C35 included in the area 51 of FIG. 5. As described above with reference to FIG. 5, first and second word line assistance cells C24' and C25', a second-type dummy cell C34', and a first-type dummy cell C35' of FIG. 6 may be arranged in two adjacent columns, that is, the fifth and sixth columns COL5 and COL6 of FIG. 5. Hereinafter, descriptions regarding FIG. 6 will be made with reference to FIG. 5.

A word line assistance cell and a dummy cell, which are arranged in the same column, may be commonly connected to a pseudo bit line. For example, as shown in FIG. 6, first and second pseudo bit lines BLP1 and BLBP1 may extend on the fifth column COL5, and the first word line assistance cell C24' and the second-type dummy cell C34' may be commonly connected to the first and second pseudo bit lines BLP1 and BLBP1. Similarly, third and fourth pseudo bit lines BLBP2 and BLP2 may extend on the sixth column COL6, and the second word line assistance cell C25' and the first-type dummy cell C35' may be commonly connected to the third and fourth pseudo bit lines BLBP2 and BLP2. In some embodiments, the negative supply voltage VSS may be applied to the first and fourth pseudo bit lines BLP1 and BLP2, and the negative supply voltage VSS or the positive supply voltage VDD may be applied to the second and third pseudo bit lines BLBP1 and BLBP2 according to control by a column driver (e.g., 16 of FIG. 16). In addition, in some embodiments, the second and third pseudo bit lines BLBP1 and BLBP2 may be electrically connected to each other.

The first and second word line assistance cells C24' and C25' may be commonly connected to a word line WL[j] (where j is an integer greater than 0), and the second-type dummy cell C34' may be disconnected from a write assistance line. In addition, the first-type dummy cell C35' may be connected to the first pseudo bit line BLP1 through the second-type dummy cell C34' and may be connected to the first write assistance line WAL[1]. As described below, the negative supply voltage VSS may be applied to the first and fourth pseudo bit lines BLP1 and BLP2, and thus, first to third NFETs N81 to N83 of the first-type dummy cell C35' may be turned off.

Each of the word line assistance cell and the dummy cell may include the same transistors as a memory cell. For example, as shown in FIG. 6, the first word line assistance cell C24' may include first and second PFETs P51 and P52 and first and second NFETs N51 and N52, which correspond to a pair of cross-coupled inverters of the memory cell, and may include third and fourth NFETs N53 and N54 corresponding to pass transistors of the memory cell. Similarly, the second word line assistance cell C25' may include first and second PFETs P61 and P62 and first to fourth NFETs N61 to N64, the second-type dummy cell C34' may include first and second PFETs P71 and P72 and first to fourth NFETs N71 to N74, and the first-type dummy cell C35' may include first and second PFETs P81 and P82 and first to fourth NFETs N81 to N84.

The first and second word line assistance cells C24' and C25' may sense the activation of the word line WL[j], that is, a rise of a voltage of the word line WL[j], and may accelerate and regenerate the voltage rise. Accordingly, despite parasitic elements of the word line WL[j], the activation of the word line WL[j] may be early identified even in the memory cell located far from a row driver (e.g., 14 of FIG. 1). To this end, a column driver (e.g., 16 of FIG. 1) may apply the negative supply voltage VSS to the second and third pseudo bit lines BLBP1 and BLBP2, and thus, the first and second word line assistance cells C24' and C25' may be activated. In addition, when the word line WL[j] is deactivated, the column driver may apply the positive supply voltage VDD to the second and third pseudo bit lines BLBP1 and BLBP2, and thus, the first and second word line assistance cells C24' and C25' may be deactivated. Accordingly, in the first and second word line assistance cells C24' and C25', nodes connected to the word line WL[j] may be floated. In some embodiments, to deactivate the first and second word line assistance cells C24' and C25', the column driver may cut off the positive supply voltage VDD supplied to the first and second word line assistance cells C24' and C25'.

Figure 7:
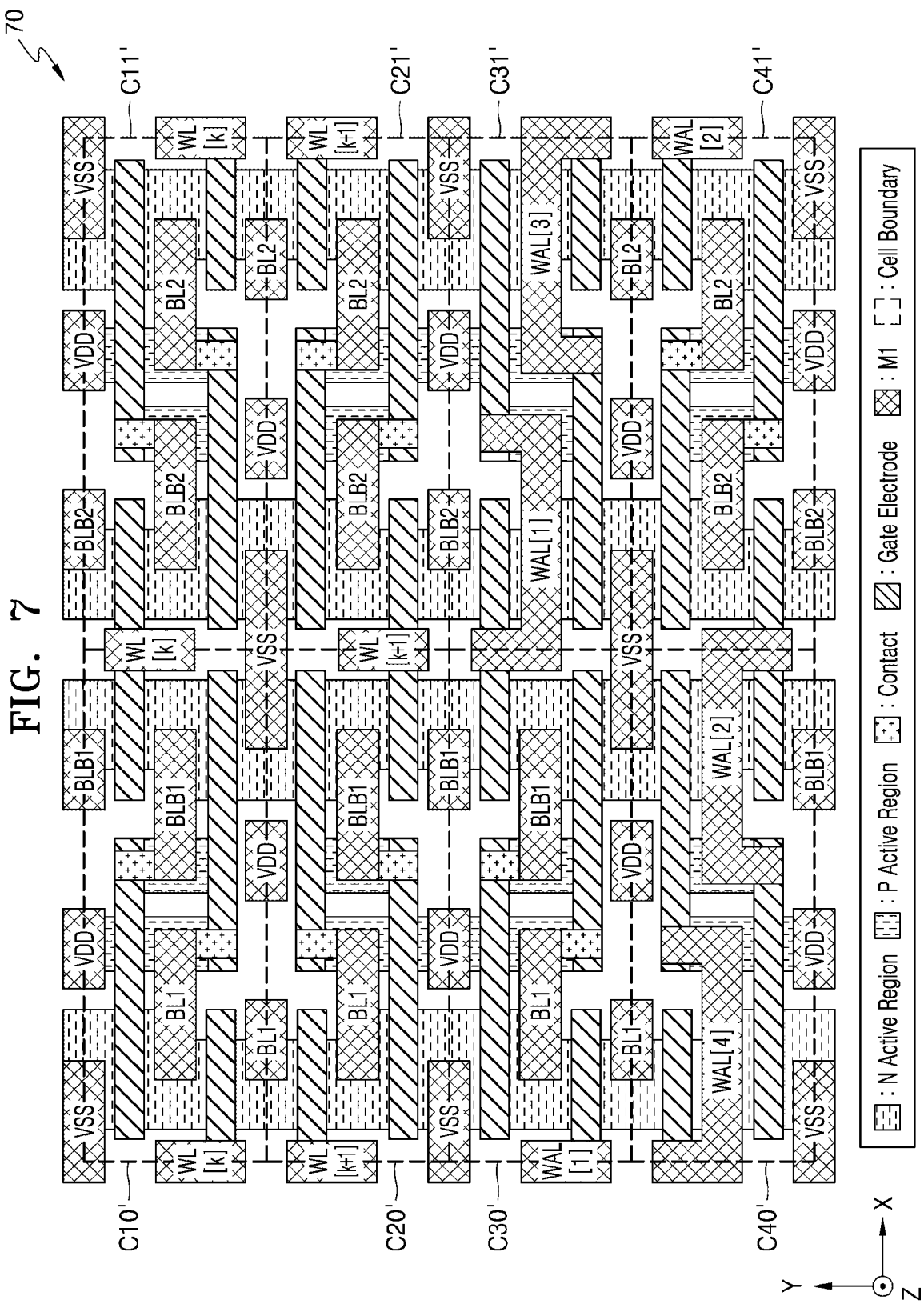
FIG. 7 is a plan view illustrating a layout of a cell array, according to an example embodiment of the inventive concept.

FIG. 7 is a plan view illustrating a layout of a cell array 70, according to an example embodiment of the inventive concept. Specifically, the plan view of FIG. 7 illustrates a layout corresponding to the eight cells C10, C11, C20, C21, C30, C31, C40, and C41 included in the area 21 of FIG. 2. A reference numeral marked on each pattern in FIG. 7 indicates a line, to which the corresponding pattern is electrically connected, and/or a voltage applied to the corresponding pattern.

As shown in FIG. 7, first and second memory cells C10' and C11' may be arranged in the same row (i.e., ROW1 of FIG. 2) and may be commonly connected to a word line WL[k] (where k is an integer greater than 0). Third and fourth memory cells C20' and C21' may be arranged in the same row (i.e., ROW2 of FIG. 2) and may be commonly connected to a word line W[k+1]. In addition, a first write assistance cell C30' and a first dummy cell C31' may be arranged in the same row (i.e., ROW3 of FIG. 2) and may be commonly connected to a first write assistance line WAL[1]. A second dummy cell C40' and a second write assistance cell C41' may be arranged in the same row (i.e., ROW4 of FIG. 2) and may be commonly connected to a second write assistance line WAL[2]. In addition, the first dummy cell C31' and another write assistance cell (i.e., C32 of FIG. 2) adjacent thereto in the +X-axis direction may be commonly connected to a third write assistance line WAL[3], and the second dummy cell C40' and another write assistance cell adjacent thereto in the −X-axis direction may be commonly connected to a fourth write assistance line WAL[4]. The first and third memory cells C10' and C20', the first write assistance cell C30', and the second dummy cell C40', which are arranged in the same column (i.e., COL1 of FIG. 2), may be commonly connected to a first bit line BL1 and a first complementary bit line BLB1. In addition, the second and fourth memory cells C11' and C21', the first dummy cell C31', and the second write assistance cell C41', which are arranged in the same column (i.e., COL2 of FIG. 2), may be commonly connected to a second bit line BL2 and a second complementary bit line BLB2.

In some embodiments, the memory cells included in the cell array 70 may have symmetrical layouts. For example, a first layout of the first memory cell C10' may be identical to a layout obtained by flipping a second layout of the second memory cell C11' about an axis parallel to a column direction, that is, to the Y-axis. In addition, a third layout of the third memory cell C20' may be identical to a layout obtained by flipping the first layout of the first memory cell C10' about an axis parallel to a row direction, that is, to the X-axis. Further, a fourth layout of the fourth memory cell C21' may be identical to both a layout obtained by flipping the third layout of the third memory cell C20' about an axis parallel to the column direction and a layout obtained by flipping the second layout of the second memory cell C11' about an axis parallel to the row direction.

As described above with reference to FIG. 3 and the like, the write assistance cell may include the same active regions and gate electrodes as the layout of the memory cell. For example, as shown in FIG. 7, the first write assistance cell C30' may include the same active regions and gate electrodes as active regions extending in the Y-axis direction and gate electrodes extending in the X-axis direction in the first layout of the first memory cell C10'. The second write assistance cell C41' may include the same active regions and gate electrodes as active regions and gate electrodes included in the fourth layout of the fourth memory cell C21'. In addition, in some embodiments, the first write assistance cell C30' may include the same patterns of a first wiring layer M1 as patterns of the first wiring layer M1, which are included in the first layout of the first memory cell C10' and connected to source/drain regions and/or gate electrodes through contacts and/or vias, and the second write assistance cell C41' may include the same patterns of the first wiring layer M1 as patterns of the first wiring layer M1, which are included in the fourth layout of the fourth memory cell C21'.

As described above with reference to FIG. 3 and the like, the dummy cell may include the same active regions and gate electrodes as the layout of the memory cell. For example, as shown in FIG. 7, the first dummy cell C31' may include the same active regions and gate electrodes as active regions and gate electrodes included in the second layout of the second memory cell C11'. The second dummy cell C40' may include the same active regions and gate electrodes as active regions and gate electrodes included in the third layout of the third memory cell C20'.

In some embodiments, the first layout of the first memory cell C10' may be identical to the fourth layout of the fourth memory cell C21', and the second layout of the second memory cell C11' may be identical to the third layout of the third memory cell C20'. Accordingly, the first and second write assistance cells C30' and C41' may have the same layout, and the first and second dummy cells C31' and C40' may have the same layout.

Figure 8A:
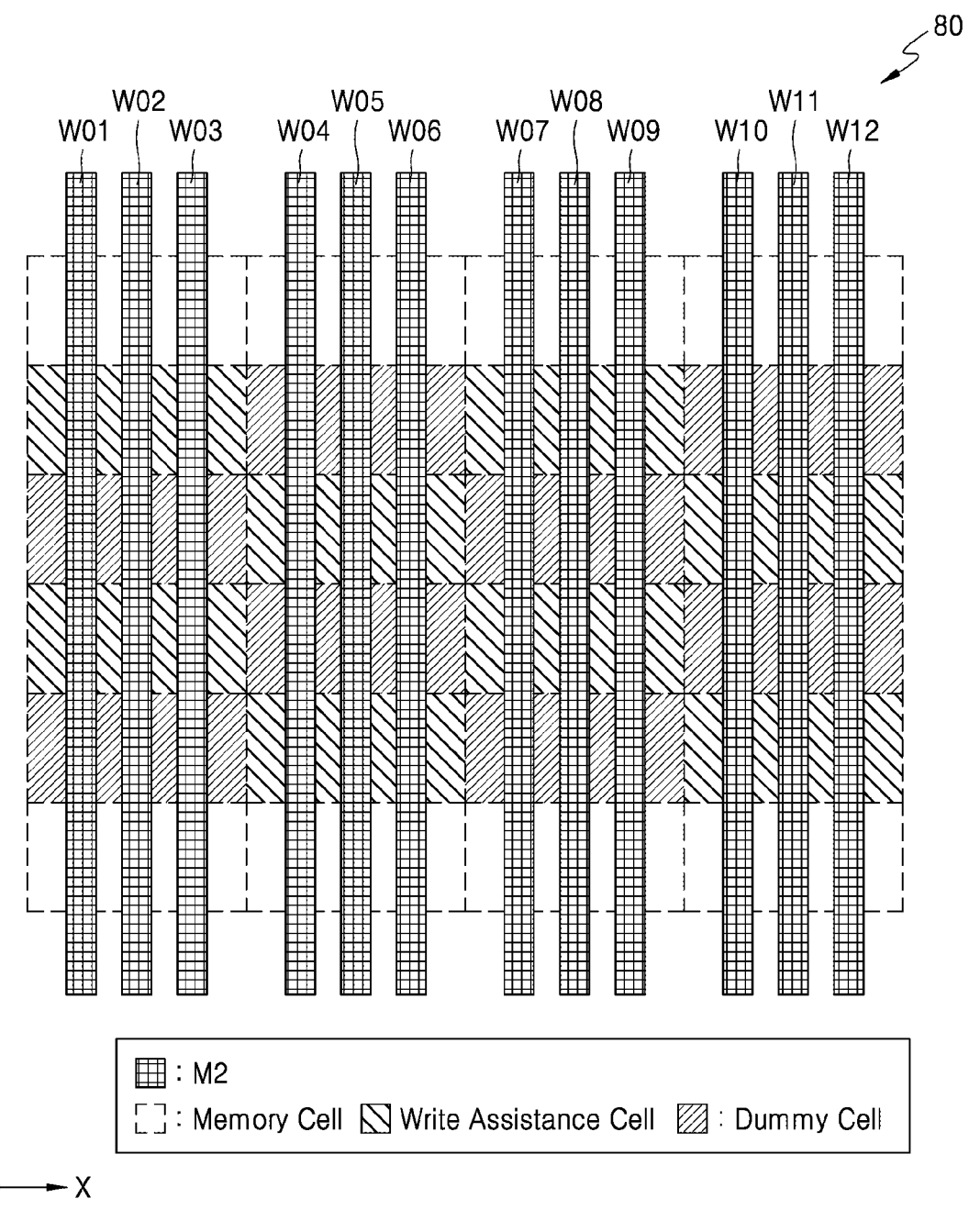
Figure 8C:
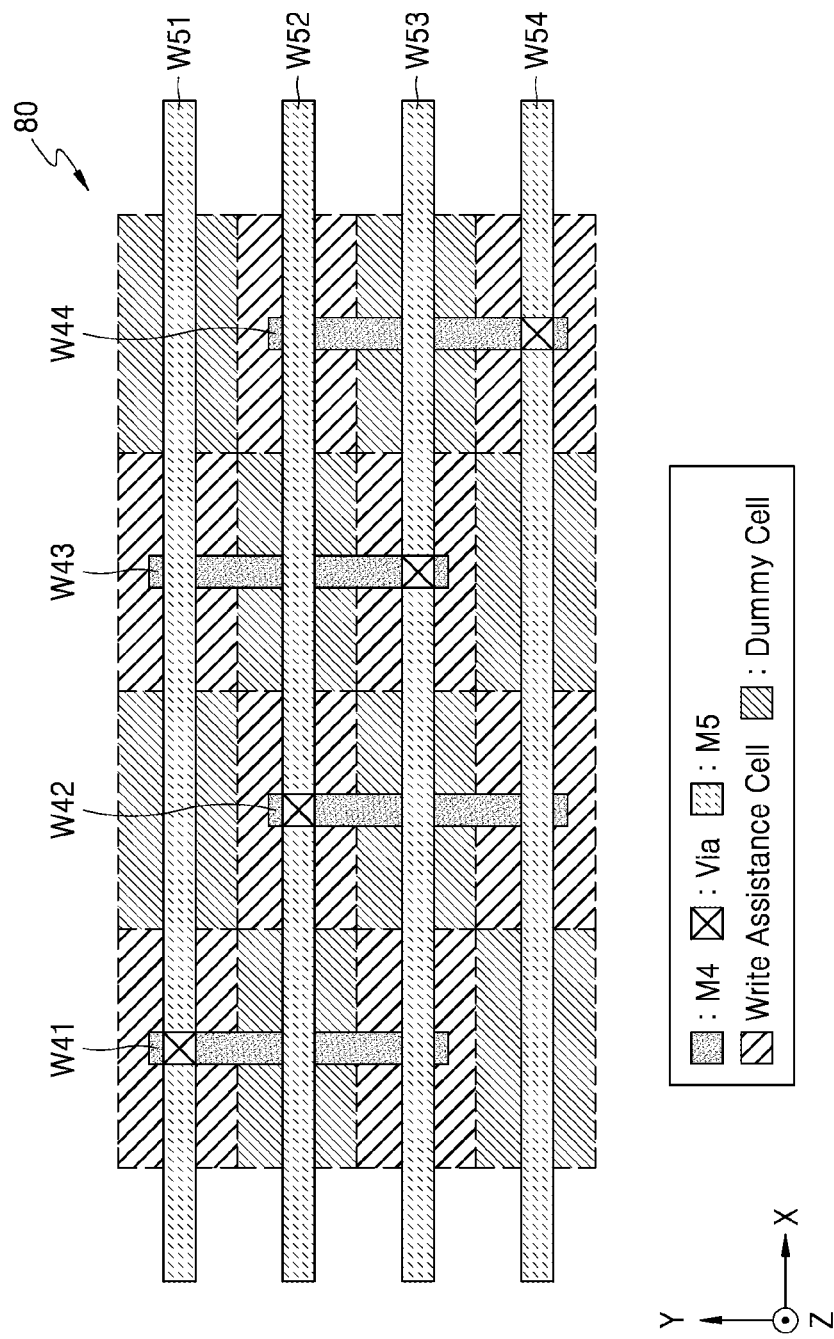

FIGS. 8A to 8C are plan views illustrating a layout of an integrated circuit 80, according to example embodiments of the inventive concept. Specifically, each of the plan views of FIGS. 8A to 8C illustrates patterns formed on a cell array. For convenience of illustration, FIGS. 8A to 8C may each illustrate only some wiring layers, and vias are illustrated in FIGS. 8A to 8C to indicate connections to patterns of an underlying wiring layer. In addition, in some embodiments, the integrated circuit 80 may further include patterns in addition to the patterns shown in FIGS. 8A to 8C. Word lines, write assistance lines, and bit lines along with lines for providing the positive supply voltage VDD and the negative supply voltage VSS may extend on the cells included in a cell array.

Referring to FIG. 8A, in a second wiring layer M2, which is an upper layer of a first wiring layer (e.g., M1 of FIG. 7), a plurality of patterns W01 to W12 may extend in a direction parallel to the Y-axis. Cells, that is, memory cells, write assistance cells, and dummy cells, which are arranged in the same column, may be commonly connected to patterns of the second wiring layer M2, which extend on the corresponding column. In some embodiments, patterns W01, W04, W07, and W10 respectively extending in columns may respectively correspond to bit lines, patterns W03, W06, W09, and W12 respectively extending in the columns may respectively correspond to complementary bit lines, and the positive supply voltage VDD may be applied to patterns W02, W05, W08, and W11 respectively extending in the columns. In some embodiments, each of the patterns W02, W05, W08, and W11, to which the positive supply voltage VDD is applied, may have portions protruding in a direction parallel to the X-axis, the portions being for vias for connection to patterns of the first wiring layer M1, that is, for vias of a first via layer.

Referring to FIG. 8B, in a third wiring layer M3, which is an upper layer of the second wiring layer M2, a plurality of patterns W21 to W37 may extend in the direction parallel to the X-axis. The memory cells arranged in the same row may be commonly connected to the patterns of the third wiring layer M3, which extend on the corresponding row. In some embodiments, the negative supply voltage VSS may be applied to the patterns W21, W23, W26, W29, W32, W35, and W37 extending along boundaries of the rows. In addition, the patterns W22 and W36 extending on the rows, in which the memory cells are arranged, may respectively correspond to the word lines.

A pattern of the third wiring layer M3, which extends in the X-axis direction on a write assistance cell, may be connected to the corresponding write assistance cell and the corresponding write assistance line. For example, the pattern W24 may be connected to a first write assistance line WAL[1], the pattern W27 may be connected to a second write assistance line WAL[2], the pattern W25 may be connected to a third write assistance line WAL[3], and the pattern W28 may be connected to a fourth write assistance line WAL[4]. As described above with reference to FIG. 2, the write assistance cells arranged in the same column may be connected to the same write assistance line, and for this purpose, the integrated circuit 80 may include patterns W41 to W44 extending in the Y-axis direction in a fourth wiring layer M4, which is an upper layer of the third wiring layer M3. Accordingly, the pattern W30 may be connected to the first write assistance line WAL[1], the pattern W33 may be connected to the second write assistance line WAL[2], the pattern W31 may be connected to the third write assistance line WAL[3], and the pattern W34 may be connected to the fourth write assistance line WAL[4]. A dummy cell may be connected to respective patterns extending on the write assistance cells adjacent thereto in the X-axis direction, and thus, may be connected to different write assistance lines. For example, a dummy cell DC may be connected to each of the patterns W24 and W43 of the third wiring layer M3, and thus, may be connected to each of the first and third write assistance lines WAL[1] and WAL[3].

Referring to FIG. 8C, in a fifth wiring layer M5, which is an upper layer of the fourth wiring layer M4, a plurality of patterns W51 to W54 may extend in the direction parallel to the X-axis. In some embodiments, the patterns W51 to W54 extending on the rows may correspond to the write assistance lines. For example, the pattern W51 may correspond to the first write assistance line WAL[1] and may be connected to the pattern W41 of the fourth wiring layer M4 through a via. The pattern W52 may correspond to the second write assistance line WAL[2] and may be connected to the pattern W42 through a via. The pattern W53 may correspond to the third write assistance line WAL[3] and may be connected to the pattern W43 through a via. The pattern W54 may correspond to the fourth write assistance line WAL[4] and may be connected to the pattern W44 through a via.

Figure 9:
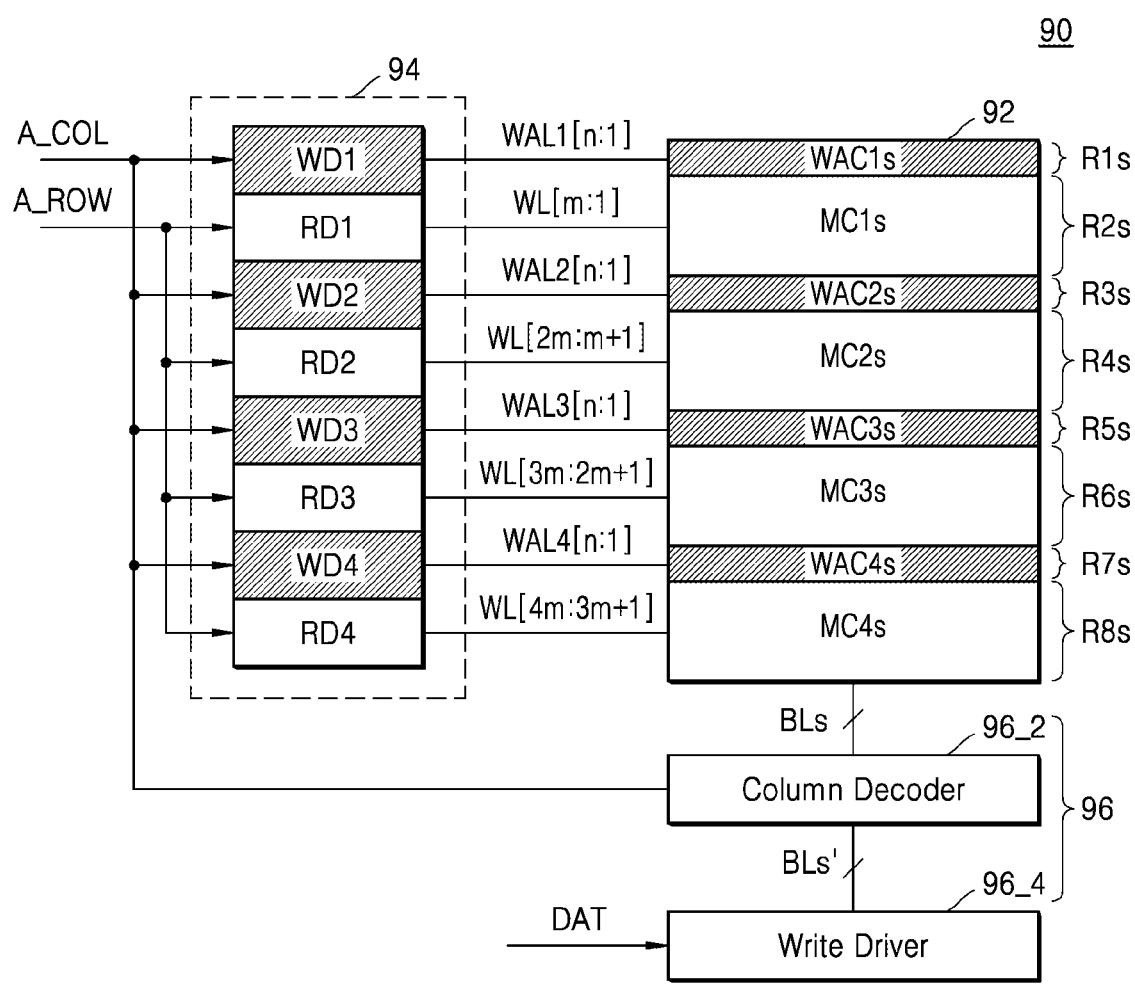
FIG. 9 is a block diagram illustrating an integrated circuit according to an example embodiment of the inventive concept.

FIG. 9 is a block diagram illustrating an integrated circuit according to an example embodiment of the inventive concept. Specifically, the block diagram of FIG. 9 illustrates a memory device 90 included in an integrated circuit. Similar to the memory device 10 of FIG. 1, the memory device 90 may include a cell array 92, a row driver 94, and a column driver 96. In the descriptions regarding FIG. 9, repeated descriptions given with reference to FIG. 1 will be omitted.

In some embodiments, the cell array 92 may include write assistance cells arranged in a plurality of row groups, each including a series of rows. For example, as shown in FIG. 9, the cell array 92 may include a plurality of first write assistance cells WAC1s arranged in a series of first rows R1s, a plurality of second write assistance cells WAC2s arranged in a series of third rows R3s, a plurality of third write assistance cells WAC3s arranged in a series of fifth rows R5s, and a plurality of fourth write assistance cells WAC4s arranged in a series of seventh rows R7s. As described above with reference to the figures, in the series of first rows R1s, the series of third rows R3s, the series of fifth rows R5s, and the series of seventh rows R7s, dummy cells may be arranged adjacent to the write assistance cells. In addition, the cell array 92 may include a plurality of first memory cells MC1s arranged in a series of second rows R2s, a plurality of second memory cells MC2s arranged in a series of fourth rows R4s, a plurality of third memory cells MC3s arranged in a series of sixth rows R6s, and a plurality of fourth memory cells MC4s arranged in a series of eighth rows R8s. As shown in FIG. 9, due to the write assistance cells arranged in each of the plurality of row groups that are spaced apart from each other, the effects caused by parasitic elements of bit lines may be further reduced in the plurality of first memory cells MC1s located far from the column driver 96 as well as in the plurality of memory cells arranged in the series of rows.

The row driver 94 may include first to fourth row decoders RD1 to RD4. As shown in FIG. 9, the first to fourth row decoders RD1 to RD4 may receive a row address A_ROW and may activate one of 4m word lines (where m is an integer greater than 1), based on the row address A_ROW.

The row driver 94 may include first to fourth write assistance drivers WD1 to WD4. As shown in FIG. 9, during a write operation, each of the first to fourth write assistance drivers WD1 to WD4 may receive a column address A_COL and may activate one of n write assistance lines (where n is an integer greater than 1), based on the column address A_COL. In some embodiments, the column address A_COL may be used for bit interleaving and may sequentially increase or decrease during the write operation. In addition, n may be identical to the number of rows, in the series of rows in which the write assistance cells are arranged. Accordingly, one write assistance line may be activated in each of the first to fourth write assistance line groups WAL1 to WAL4, and the write assistance cells arranged in the same column in the cell array 92 may operate simultaneously or in concert.

The column driver 96 may include a column decoder 96_2 and a write driver 96_4. The column decoder 96_2 may receive the column address A_COL, may select some of the plurality of bit lines BLs, based on the column address A_COL, and may connect the selected bit lines BLs' to the write driver 96_4. The write driver 96_4 may apply voltages and/or currents to the selected bit lines BLs', based on the data DAT.

Figure 10:
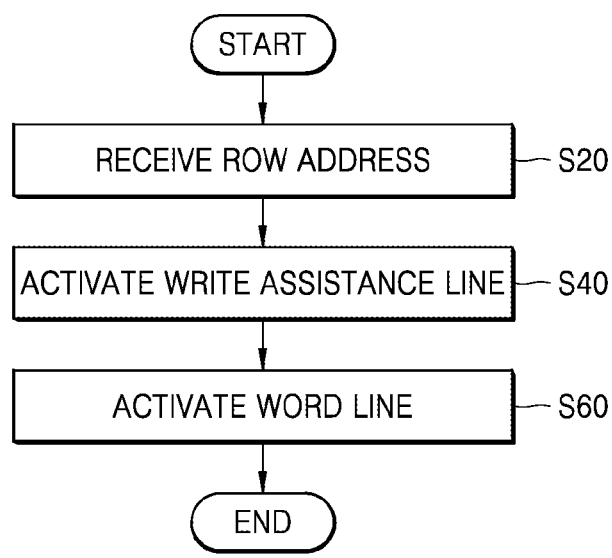
FIG. 10 is a flowchart illustrating a method of operating an integrated circuit, according to an example embodiment of the inventive concept.

FIG. 10 is a flowchart illustrating a method of operating an integrated circuit, according to an example embodiment of the inventive concept. Specifically, the flowchart of FIG. 10 illustrates an example of a write operation performed by a memory device included in an integrated circuit. As shown in FIG. 10, a method of operating the integrated circuit may include a plurality of operations S20, S40, and S60. In some embodiments, the method of FIG. 10 may be performed by the row driver 14 of FIG. 1, and the following descriptions regarding FIG. 10 will be made with reference to FIG. 1.

Referring to FIG. 10, in operation S20, the row address A_ROW may be received. For example, the row driver 14 may receive the row address A_ROW indicating an area to which data is to be written in the cell array 12. In some embodiments, the memory device 10 may include an address decoder which may generate the row address A_ROW by decoding an address received from outside the memory device 10.

In operation S40, the write assistance line WAL may be activated. For example, the control logic 18 may identify a write command by decoding the command CMD and may generate the first control signal CTR1 for a write operation. The row driver 14 may activate the write assistance line WAL, based on the first control signal CTR1, before a word line is activated in operation S60 described below. Accordingly, the plurality of write assistance cells WACs included in the cell array 12 may operate. An example of operation S40 will be described below with reference to FIG. 11.

In operation S60, the word line may be activated. For example, the row driver 14 may activate one word line from among the plurality of first word lines WL1s and the plurality of second word lines WL2s, based on the row address A_ROW received in operation S20 and the first control signal CTR1. Accordingly, memory cells connected to the selected word line may be selected, and due to the plurality of write assistance cells WACs having started operations in advance as described above with reference to FIG. 4, data may be safely written to the selected memory cells.

Figure 11:
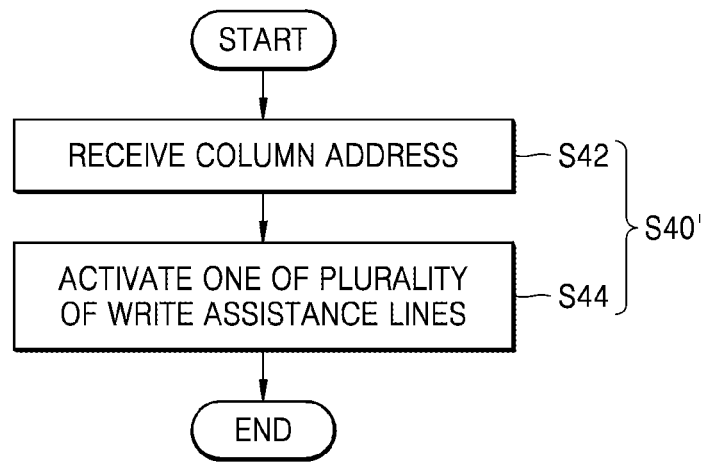
FIG. 11 is a flowchart illustrating a method of operating an integrated circuit, according to an example embodiment of the inventive concept.

FIG. 11 is a flowchart illustrating a method of operating an integrated circuit, according to an example embodiment.

Specifically, the flowchart of FIG. 11 illustrates an example of operation S40 of FIG. 10. As described above with reference to FIG. 10, in operation S40' of FIG. 11, the write assistance line WAL may be activated. As shown in FIG. 11, operation S40' may include operation S42 and operation S44. In some embodiments, operation S40' may be performed by the row driver 94 of FIG. 9, and descriptions regarding FIG. 11 will be made with reference to FIG. 9.

Referring to FIG. 11, in operation S42, the column address A_COL may be received. For example, the row driver 94 (or the first to fourth write assistance drivers WD1 to WD4) may receive the column address A_COL. In some embodiments, the column address A_COL may be generated by decoding, by the address decoder included in the memory device 90, an address received from outside the memory device 90. In addition, in some embodiments, the column address A_COL may sequentially increase or decrease for bit interleaving.

In operation S44, one of a plurality of write assistance lines may be activated. For example, the row driver 94 may activate one of the plurality of write assistance lines to activate write assistance cells arranged in a column corresponding to the column address A_COL. The row driver 94 may activate one write assistance line in each of the first to fourth write assistance line groups WAL1 to WAL4, and thus, the write assistance cells arranged in the column corresponding to the column address A_COL in the cell array 92 may be simultaneously activated.

Figure 12:
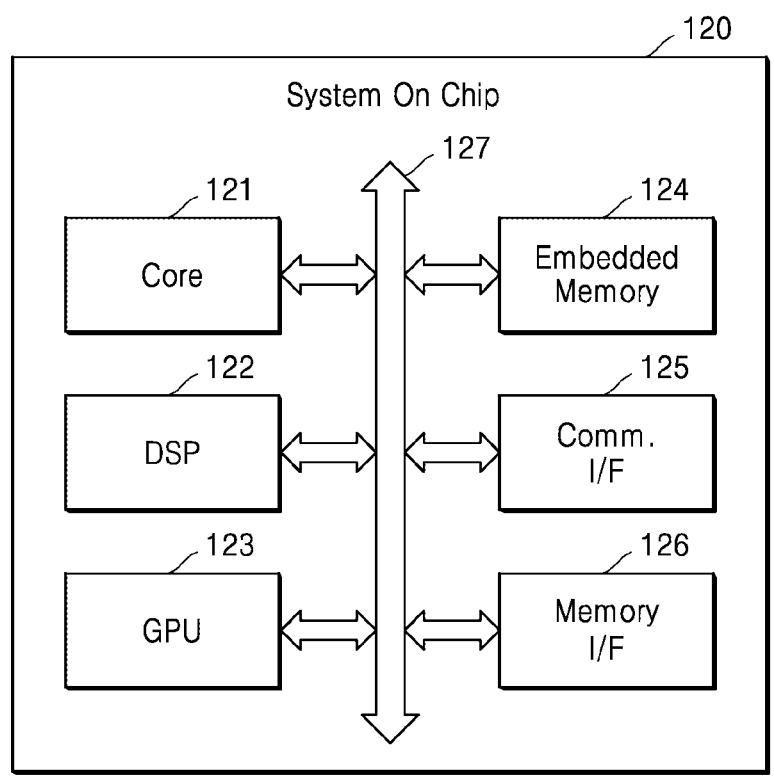
FIG. 12 is a block diagram illustrating a system-on-chip according to an example embodiment of the inventive concept.

FIG. 12 is a block diagram illustrating a system-on-chip (SoC) 120 according to an example embodiment of the inventive concept. The SoC 120 may refer to an integrated circuit in which parts of a computing system or another electronic system are integrated. For example, an application processor (AP), which is an example of the SoC 120, may include a processor and parts for other functions. As shown in FIG. 12, the SoC 120 may include a core 121, a digital signal processor (DSP) 122, a graphics processing unit (GPU) 123, an embedded memory 124, a communication interface 125, and a memory interface 126. The components of the SoC 120 may communicate with each other through a bus 127.

The core 121 may process instructions and may control operations of the components included in the SoC 120. For example, the core 121 may drive an operating system and execute applications on the operating system, by processing a series of instructions. The DSP 122 may generate useful data by processing a digital signal, for example, a digital signal provided from the communication interface 125. The GPU 123 may generate data for an image, which is output via a display device, from image data provided from the embedded memory 124 or the memory interface 126, and may also encode the image data. In some embodiments, the memory device described above with reference to the figures may be included, as a cache memory and/or a buffer, in the core 121, the DSP 122, and/or the GPU 123. Accordingly, due to the improved reliability and efficiency of the memory device, the core 121, the DSP 122, and/or the GPU 123 may also have improved reliability and efficiency.

The embedded memory 124 may store data required to operate the core 121, the DSP 122, and the GPU 123. In some embodiments, the embedded memory 124 may include the memory device described above with reference to the figures. Accordingly, the embedded memory 124 may provide a reliable write operation and may have reductions in area and power consumption, and as a result, the operation reliability and efficiency of the SoC 120 may be improved.

The communication interface 125 may provide an interface for a communication network or one-to-one communication. The memory interface 126 may provide an interface for an external memory of the SoC 120, for example, for dynamic random access memory (RAM), flash memory, or the like.

While the inventive concept has been particularly shown and described with reference to embodiments thereof, it will be understood that various changes in form and details may be made therein without departing from the spirit and scope of the following claims.

What is claimed is:

1. An integrated circuit comprising:
   a cell array comprising a plurality of memory cells in a plurality of first rows and a plurality of write assistance cells in at least one second row;
   a plurality of word lines respectively extending on the plurality of first rows;
   at least one write assistance line respectively extending on the at least one second row; and
   a row driver connected to the plurality of word lines and the at least one write assistance line, the row driver being configured to activate at least one of the plurality of write assistance cells through the at least one write assistance line during a write operation,
   wherein each of the plurality of write assistance cells comprises a same transistor configuration as each of the plurality of memory cells and has a same footprint as each of the plurality of memory cells, and
   wherein the row driver is further configured to activate one of the at least one write assistance line before activating one of the plurality of word lines during a write operation.

2. The integrated circuit of claim 1, wherein each of the plurality of write assistance cells comprises:
   a first p-channel field effect transistor (PFET), a first n-channel field effect transistor (NFET), and a second NFET, which are connected in series between a first power node and a second power node, the first power node being configured to receive a positive supply voltage, and the second power node being configured to receive a negative supply voltage; and
   a second PFET, a third NFET, and a fourth NFET, which are connected in series between the first power node and the second power node.

3. The integrated circuit of claim 2, wherein each of the first PFET and the second NFET comprises a control terminal connected to a complementary bit line,
   wherein each of the second PFET and the fourth NFET comprises a control terminal connected to a bit line,
   wherein the first NFET comprises a control terminal, which is connected to a write assistance line, and a current terminal, which is connected to the bit line, and
   wherein the third NFET comprises a control terminal, which is connected to the write assistance line, and a current terminal, which is connected to the complementary bit line.

4. The integrated circuit of claim 1, wherein the cell array further comprises a plurality of first dummy cells arranged respectively adjacent to the plurality of write assistance cells in a row direction or a column direction in the at least one second row, and
   wherein each of the plurality of first dummy cells comprises the same transistor configuration as each of the plurality of memory cells and has the same footprint as each of the plurality of memory cells.

5. The integrated circuit of claim 4, wherein each of the plurality of first dummy cells comprises:
   a third PFET and a fifth NFET, which respectively comprise control terminals connected to a first write assistance line;
   a fourth PFET and a sixth NFET, which respectively comprise control terminals connected to a second write assistance line;
   a seventh NFET, which comprises a control terminal connected to the first write assistance line; and
   an eighth NFET, which comprises a control terminal connected to the second write assistance line, and
   each of the third PFET and the fourth PFET comprises a floated current terminal.

6. The integrated circuit of claim 5, wherein each of the plurality of first dummy cells and a first write assistance cell, which is arranged adjacent to one side thereof in a same one of the at least second row, are commonly connected to the first write assistance line, and each of the plurality of first dummy cells and a second write assistance cell, which is arranged adjacent to another side thereof in the same one of the at least one second row, are commonly connected to the second write assistance line.

7. The integrated circuit of claim 4, wherein the cell array further comprises:
   a plurality of word line assistance cells in at least one column; and
   at least one second dummy cell in an area in which the at least one second row intersects with the at least one column, and
   wherein each of the plurality of word line assistance cells and the at least one second dummy cell comprises the same transistor configuration as each of the plurality of memory cells and has the same footprint as each of the plurality of memory cells.

8. An integrated circuit comprising:
   a cell array comprising a plurality of cells, each of the plurality of cells comprising a same transistor configuration and having the same footprint; and
   a row driver configured to, during a write operation, activate at least one write assistance cell from among the plurality of cells and select at least one memory cell from among the plurality of cells,
   wherein the plurality of cells comprise:
   a plurality of memory cells, including the at least one memory cell, arranged in a series of first rows;
   a first one of the at least one write assistance cell and a first dummy cell, which are arranged adjacent to each other in a second row; and
   a second dummy cell and a second one of the at least one write assistance cell, which are arranged adjacent to each other in a third row that is adjacent to the second row,
   wherein the first one of the at least one write assistance cell and the second dummy cell are arranged in a first column, and
   wherein the first dummy cell and the second one of the at least one write assistance cell are arranged in a second column that is adjacent to the first column.

9. The integrated circuit of claim 8, further comprising:
   a plurality of word lines respectively extending on the series of first rows;
   a first write assistance line extending on the second row and connected to the first one of the at least one write assistance cell and the first dummy cell; and a second write assistance line extending on the third row and connected to the second dummy cell and the second one of the at least one write assistance cell, wherein the row driver is further configured to activate the first write assistance line and the second write assistance line in a mutually exclusive manner.

10. The integrated circuit of claim 9, wherein the plurality of cells further comprise:

a third one of the at least one write assistance cell arranged in a fourth row that is adjacent to the third row; and a fourth one of the at least one write assistance cell arranged in a fifth row that is adjacent to the fourth row, and wherein the integrated circuit further comprises: a first pattern extending in a column direction and connected to the first write assistance line and the third one of the at least one write assistance cell; and a second pattern extending in the column direction and connected to the second write assistance line and the fourth one of the at least one write assistance cell.

11. The integrated circuit of claim 9, further comprising:

a third pattern and a fourth pattern both arranged in a first wiring layer, in which the plurality of word lines are arranged, and respectively extending on the first one of the at least one write assistance cell and the second one of the at least one write assistance cell, wherein the first one of the at least one write assistance cell is connected to the first write assistance line through the third pattern, and wherein the second one of the at least one write assistance cell is connected to the second write assistance line through the fourth pattern.

12. The integrated circuit of claim 11, wherein the first dummy cell is connected to the first write assistance line through the third pattern, and wherein the second dummy cell is connected to the second write assistance line through the fourth pattern.

13. The integrated circuit of claim 8, wherein the plurality of cells further comprise:

a plurality of word line assistance cells arranged in a third column and a fourth column, which are adjacent to each other; and at least one third dummy cell arranged in an area in which the series of first rows and the third row intersect with the third column and the fourth column, and wherein the at least one third dummy cell comprises a different circuit than that of the first dummy cell and the second dummy cell.

14. The integrated circuit of claim 8, wherein the plurality of cells respectively have a plurality of layouts that are symmetric to one another, and wherein each of the first one of the at least one write assistance cell, the first dummy cell, the second dummy cell, and the second one of the at least one write assistance cell comprises active regions and gate electrodes identical to one of the plurality of layouts.

15. An integrated circuit comprising:

a cell array comprising a plurality of cells, each of the plurality of cells comprising a same transistor configuration and having a same footprint; and a row driver configured to, during a write operation, activate at least one write assistance cell from among the plurality of cells and select at least one memory cell from among the plurality of cells, wherein the plurality of cells comprise:

a plurality of first memory cells, including the at least one memory cell, arranged in a series of first rows;

the at least one write assistance cell comprising a plurality of first write assistance cells arranged in at least one second row that is adjacent to the series of first rows; and the at least one memory cell comprising a plurality of second memory cells arranged in a series of third rows that is adjacent to the at least one second row, wherein the plurality of cells further comprise a plurality of dummy cells arranged respectively adjacent to the plurality of first write assistance cells in a row direction or a column direction in the at least one second row.

16. The integrated circuit of claim 15, further comprising:

a plurality of first word lines respectively extending on the series of first rows;

at least one first write assistance line respectively extending on the at least one second row; and a plurality of second word lines respectively extending on the series of third rows, wherein the row driver is further configured to, during a write operation, activate one of the at least one first write assistance line before activating one of the plurality of first word lines and the plurality of second word lines.

17. The integrated circuit of claim 15, wherein the at least one write assistance cell comprises a plurality of second write assistance cells arranged in at least one fourth row that is adjacent to one side of the series of third rows, and wherein a number of the series of first rows is equal to a number of the at least one second row.

18. The integrated circuit of claim 17, further comprising:

at least one first write assistance line extending on the at least one second row; and at least one second write assistance line extending on the at least one fourth row, wherein the row driver is further configured to, during a write operation, activate one of the at least one first write assistance line and one of the at least one second write assistance line such that a first one of the at least one write assistance cell and a second one of the at least one write assistance cell in the same column are selected.

* * * * *